United States Patent [19]

Shintani

[11] Patent Number: 5,300,796
[45] Date of Patent: Apr. 5, 1994

[54] SEMICONDUCTOR DEVICE HAVING AN INTERNAL CELL ARRAY REGION AND A PERIPHERAL REGION SURROUNDING THE INTERNAL CELL ARRAY FOR PROVIDING INPUT/OUTPUT BASIC CELLS

[75] Inventor: Yoshio Shintani, Kokubunji, Japan

[73] Assignee: Hitachi, Ltd., Tokyo, Japan

[21] Appl. No.: 898,363

[22] Filed: Jun. 4, 1992

Related U.S. Application Data

[63] Continuation of Ser. No. 617,795, Nov. 26, 1990, abandoned, which is a continuation of Ser. No. 367,324, Jun. 16, 1989, abandoned.

[30] Foreign Application Priority Data

Jun. 29, 1988 [JP] Japan .................. 63-162155

[51] Int. Cl.⁵ ............... H01L 27/02; H01L 27/10
[52] U.S. Cl. .................... 257/203; 257/202
[58] Field of Search .......... 357/40, 41, 42, 45; 257/202, 203, 204, 206, 205

[56] References Cited

U.S. PATENT DOCUMENTS

| | | | |
|---|---|---|---|
| 4,412,237 | 10/1983 | Matsumuma et al. ............ | 357/45 |
| 4,631,571 | 12/1986 | Tsubokura . | |
| 4,893,168 | 1/1990 | Takahashi et al. ............ | 257/204 |

FOREIGN PATENT DOCUMENTS

| | | | |
|---|---|---|---|
| 0257437 | 3/1988 | European Pat. Off. ............ | 357/45 |
| 61-144843 | 7/1986 | Japan ............ | 257/203 |
| 62-114259 | 5/1987 | Japan ............ | 357/40 |
| 63-53948 | 3/1988 | Japan . | |
| 63-301553 | 12/1988 | Japan ............ | 357/40 |
| 64-18239 | 1/1989 | Japan ............ | 357/45 |
| 2143990 | 2/1985 | United Kingdom . | |

*Primary Examiner*—J. Carroll
*Attorney, Agent, or Firm*—Antonelli, Terry, Stout & Kraus

[57] ABSTRACT

A semiconductor integrated circuit device of a master slice system having I/O cells for forming an input-output circuit formed so as to be able to select an input function or an output function, arranged in a radial layout around an internal cell array region. Each I/O cell forming region is tapered radially inward, smaller circuit elements of the I/O cell for forming the input-output circuit are disposed on the side of the internal cell array region, and larger circuit elements of the same are disposed on the side of the periphery of the semiconductor pellet. Thus, the semiconductor pellet is provided with more I/O cell forming regions than the semiconductor pellet of the same size of the conventional semiconductor integrated circuit device.

25 Claims, 6 Drawing Sheets

SEMICONDUCTOR DEVICE HAVING AN INTERNAL CELL ARRAY REGION AND A PERIPHERAL REGION SURROUNDING THE INTERNAL CELL ARRAY FOR PROVIDING INPUT/OUTPUT BASIC CELLS

This application is a continuation of application Ser. No. 07/617,795, filed on Nov. 26, 1990, abandoned, which is a continuation of application Ser. No. 07/367,324, filed Jun. 16, 1989, abandoned.

BACKGROUND OF THE INVENTION

The present invention relates generally to a semiconductor integrated circuit and, more particularly, to a semiconductor integrated circuit fabricated by a master slice approach, such as a gate array.

A master slice approach method is able to produce various semiconductor integrated circuits respectively having different logic functions and memory functions from a master wafer by modifying a wiring pattern formed on the master wafer. The master wafer comprises, for example, rows each of a plurality of basic cells each consisting of complementary MISFETs. A plurality of basic cells for an I/O buffer circuit, respectively corresponding to external terminals are arranged in the periphery of the semiconductor integrated circuit along the direction of arrangement of the external terminals.

Recent advancement in the function of the gate array type semiconductor integrated circuit device brought about an urgent demand for the further miniaturization and increase in the degree of integration of the circuit elements of the gate array.

A technique for the miniaturization of circuit elements and the augmentation of the degree of integration of the gate array is disclosed in Japanese Patent Laid-open No. 63-53948. According to this known technique, a rectangular basic cell for an input-output buffer circuit (hereinafter referred to as "I/O cell") disposed outside an internal cell array region in which a plurality of rows of basic cells are arranged at predetermined intervals along the direction of lines with wiring regions therebetween is divided into a basic cell for an input buffer circuit (hereinafter referred to as "input circuit cell") and a basic cell for an output buffer circuit (hereinafter referred to as "output circuit cell"), such input circuit cells and such output circuit cells are arranged alternately along the direction of arrangement of such I/O cells, and external terminals (hereinafter referred to as "bonding pads") are arranged around the I/O cell region in correspondence with the I/O cells.

This known technique divides an I/O cell forming region into input circuit cell forming regions and output circuit cell forming regions to decide the size of the input circuit cell forming regions without being restricted by the size of the output circuit cells. The size of the input circuit forming region is diminished by an area corresponding to a vacant space in which no circuit element is formed or an area saved by the miniaturization of the circuit elements.

SUMMARY OF THE INVENTION

This known technique is able to diminish the input circuit cell forming region without being restricted by the size of MISFETs for the output buffer circuit, which is greater than that of MISFETs for the input buffer circuit, to enhance the capacity for driving external devices. However, this known technique has the following problems.

The basic cells in the internal cell array region can be miniaturized in accordance with a scaling rule, while the diminution of the size and pitch of the bonding pads is limited to a certain degree by restrictions on manufacturing conditions, such as the accuracy of bonding, and the size of bonding wires.

The lower limit of width of the I/O cell forming region on the side of the bonding pads is restricted by the bonding pads and hence the width cannot be diminished below a value limited by the bonding pads. The width of the I/O cell forming region on the side of the internal cell array region is the same as the width of the I/O cell forming region on the side of the bonding pads limited by the bonding pads. Accordingly, the diminution of the area of the I/O cell forming region below a certain lower limit is impossible even if the area of the input circuit cell forming region is diminished by miniaturizing the circuit elements to be arranged in the input circuit cell forming region, because the diminution of the width of the I/O cell forming region on the side of the bonding pads is limited by the bonding pads.

Suppose that the circuit elements in the basic cell are miniaturized, gates are formed in an internal cell array region having an area smaller than that of an ordinary internal array region, and the number of the gates formed in the internal array region is greater than that of gates formed in the ordinary internal array region. Since the length of the sides of the internal cell array region diminishes when the area of the same is diminished, the number of the I/O cells which can be arranged around the internal cell array region diminishes if the area of the I/O cell forming region remains unchanged. However, when the number of the gates is increased, accordingly. Therefore, the number of the I/O cells must be increased region must be diminished and the number of I/O cells arranged around the internal cell array region must be increased. However, as mentioned above, it is impossible to diminish the area of the I/O cell forming region. Accordingly, a semiconductor pellet having a greater area must be used to form an increased number of I/O cells and, consequently, the size of the semiconductor integrated circuit device is increased despite the diminution of the area of the internal cell array region, which entails difficulty in mounting semiconductor integrated circuit devices in a high mounting density.

The present invention has been made in view of the foregoing problems and it is therefore an object of the present invention to provide a technique capable of forming an increased number of I/O cells without requiring a semiconductor pellet to have an increased area.

In a first aspect of the present invention, a semiconductor integrated circuit device of a master slice type has an internal cell array region formed on a semiconductor pellet, and a plurality of I/O cell forming regions radially arranged along the periphery of the semiconductor pellet from the center of the internal cell array region around the internal cell array region, wherein each I/O cell forming region is divided into a plurality of cell forming regions along the periphery of the semiconductor pellet from the center of the internal cell array regions, the cell forming regions having a greater area are arranged in the outer portion of the I/O cell forming region on a side thereof near an edge of semiconductor pellet, and the cell forming regions having a smaller area are arranged in the inner portion of the I/O cell forming region on a side thereof near the internal cell array forming region.

In a second aspect of the present invention, a semiconductor integrated circuit device of a master slice type has an internal cell array region formed on a semiconductor pellet, and a plurality of I/O cell forming regions radially arranged around the internal cell array region along the periphery of the semiconductor pellet from the center of the internal cell array region, wherein the width of I/O cell forming regions on a side near the periphery of the semiconductor pellet are greater than those of the I/O cell forming regions located adjacent a side of the internal cell array region.

Thus, the I/O cell forming regions and bonding pads can be arranged in the corners of the semiconductor pellet, unlike that of the I/O cell forming regions formed in the conventional semiconductor integrated circuit device. Accordingly, the number of I/O cell forming regions and the number of bonding pads of the semiconductor integrated circuit device according to the present invention are greater than those of the conventional semiconductor integrated circuit device using a semiconductor pellet having the same area.

Furthermore, the degree of integration of the semiconductor integrated circuit device can be increased because the circuit elements in the basic cell are miniaturized and the number of the I/O cells arranged around the internal cell array region need not be decreased even if the area of the internal cell array region is diminished.

BRIEF DESCRIPTION OF THE DRAWINGS

The above and other objects, features and advantages of the present invention will become more apparent from the following description taken in conjunction with the accompanying drawings, in which.

DESCRIPTION OF THE PREFERRED EMBODIMENTS

First Embodiment (FIGS. 1, 2, 3A, 3B, 4A, 4B)

A semiconductor integrated circuit device in a first embodiment according to the present invention is a CMOS gate array.

Figure 1:
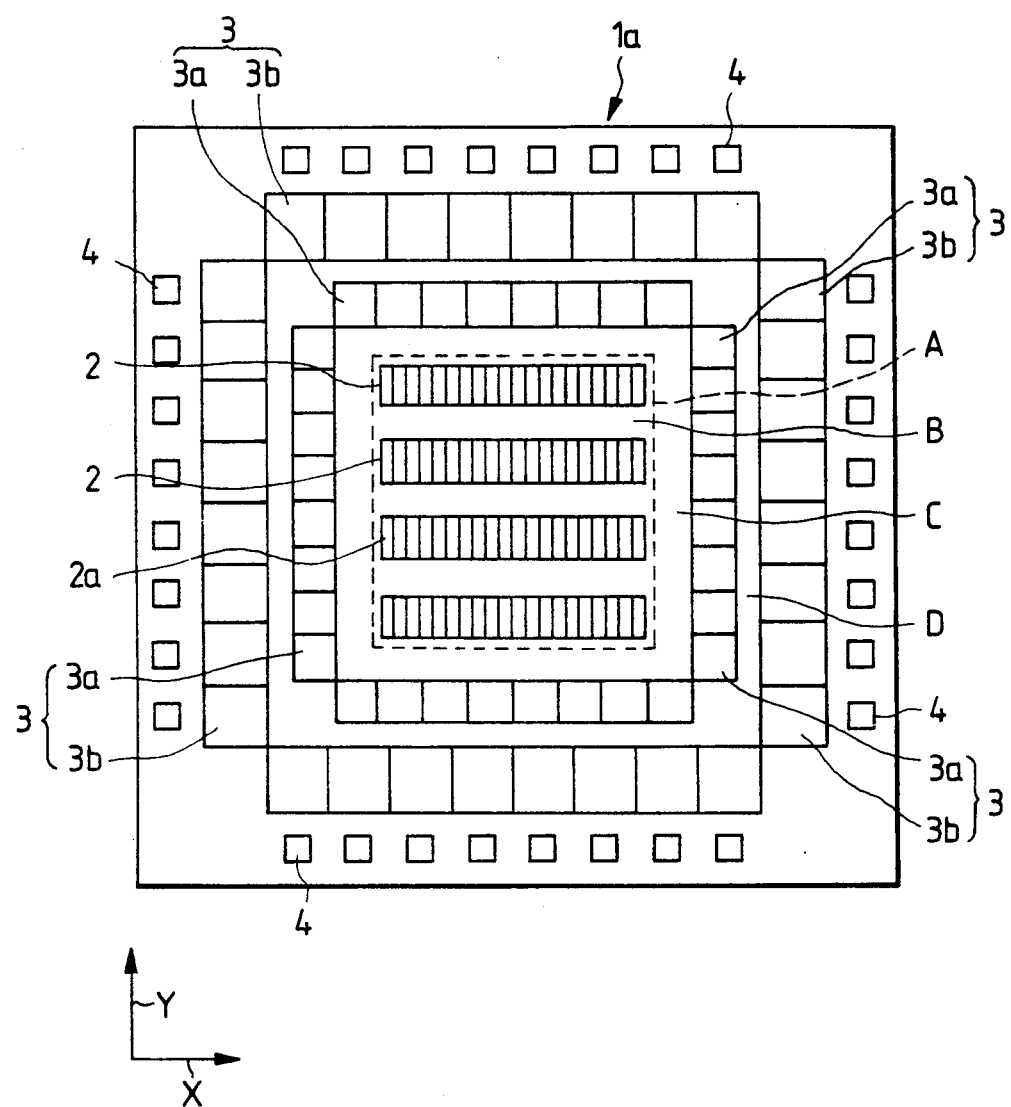
FIG. 1 is a schematic plan view of a semiconductor integrated circuit device in a first embodiment according to the preset invention.

As shown in FIG. 1, an internal cell array region A is disposed in the central portion of a semiconductor pellet 1a. A plurality of basic cell lines 2 extending in the X direction are arranged in the Y direction at intervals. Spaces between the adjacent basic cell lines 2 are internal wiring regions B. Each basic cell line 2 comprises a plurality of basic cells 2a sequentially arranged along the X direction. Each basic cell 2a comprises a plurality of pairs each of an N-channel MOS transistor (hereinafter abbreviated to "NMOS") and a P-channel MOS transistor (hereinafter abbreviated to "PMOS"). The NMOSs are the same in size and function.

The internal wiring regions B formed between the adjacent basic cell lines 2 may be provided each with tens of aluminum conductors formed on an under field $SiO_2$ film.

A logic circuit having desired logical functions is formed by connecting the input and output terminals of the NMOSs and PMOSs of the basic cells 2a, and connecting logic cells formed within each basic cell line 2 by signal lines, not shown, and power lines, not shown.

External wiring region C is formed around the internal cell array region A. A predetermined number of first cell forming regions 3a are arranged along the periphery of the external wiring region C. A wiring region D is formed around the first cell forming regions 3a. Second cell forming regions 3b each having an area greater than that of the first cell forming region 3a are arranged along the periphery of the wiring region D. The number of second cell forming regions 3b is equal to the number of first cell forming regions 3a, and the second cell forming regions 3b correspond to the first cell forming regions 3a, respectively.

In the first embodiment, each first cell forming region 3a and the corresponding second cell forming region 3b constitute an I/O cell forming region 3. Bonding pads 4 are arranged around the second cell forming regions 3b along the X and Y directions in one-to-one correspondence with the second cell forming regions 3b.

An output buffer circuit receives an electric signal from an internal circuit having small electrical driving ability, amplifies the power of the electric signal to a power level high enough to drive an external electrical load, and protects the integrated circuit device from external surge noise. Circuit elements for the output buffer circuit are MOSs having a high driving ability, namely, MOSs having a large W/L ratio (W: gate width, L: gate length), because capacitance of the output bonding pad must be charged and discharged. Accordingly, circuit elements for the output circuit are larger than those for the input circuit. Therefore, the circuit elements for the input circuit are formed in the first cell forming regions 3a, and the circuit elements for the output circuit, which are larger than those for the input circuit, are formed in the second cell forming regions 3b.

Figure 2:
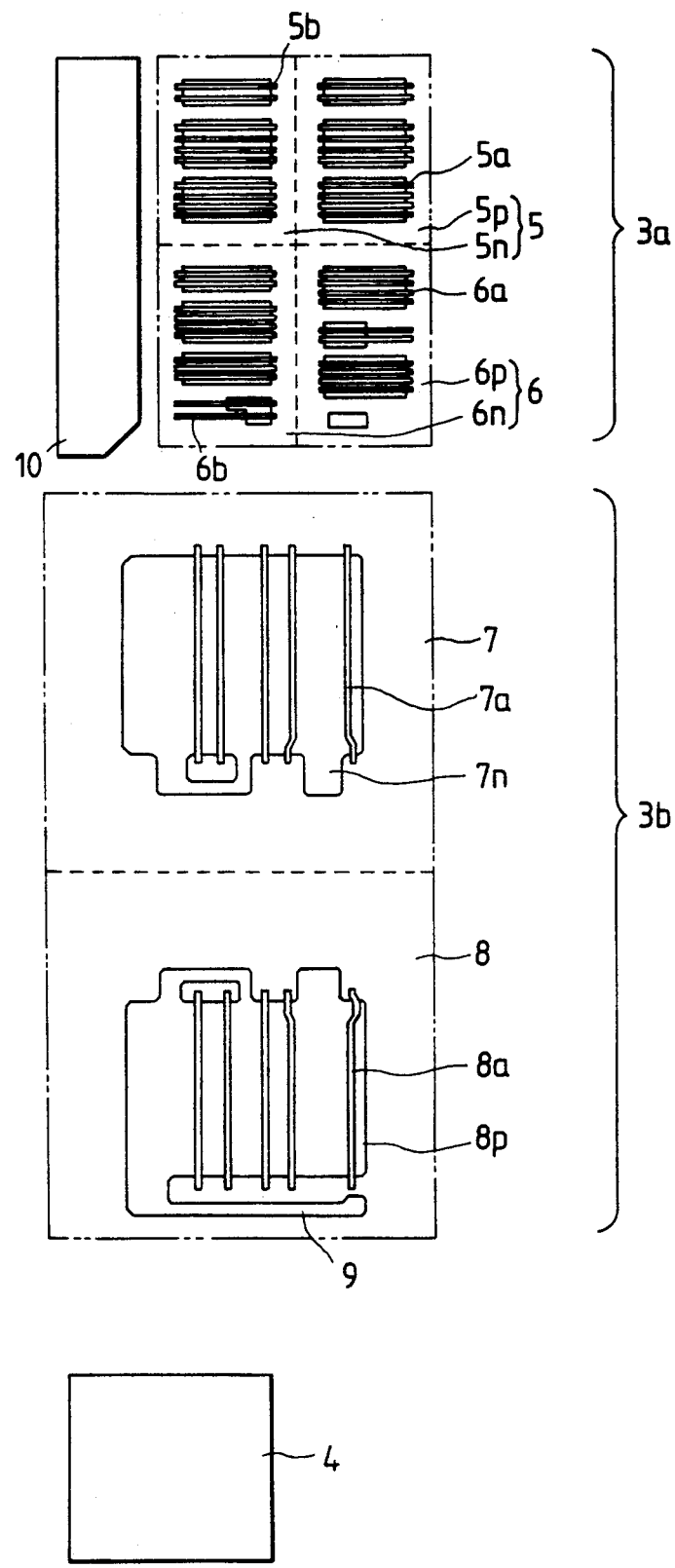
FIG. 2 is a plan view of I/O cells formed in an I/O cell forming region in the semiconductor integrated circuit device of FIG. 1.

Referring to FIG. 2, the first cell forming region 3a comprises a PMOS region 5P for a prebuffer circuit, a PMOS region 6P for an input circuit (hereinafter referred to as "input PMOS region"), an NMOS region 5N for the prebuffer circuit, and an NMOS region 6N for the input circuit (hereinafter referred to as "input NMOS region"). The second cell forming region 3b comprises an NMOS region 7 for the output circuit (hereinafter referred to as "output NMOS region") formed near the first cell forming region 3a, and a protective resistance 9 formed near the bonding pad 4, and a PMOS region 8 for the output circuit (hereinafter referred to as "output PMOS region") formed between the output NMOS region 7 and the protective resistance 9.

The circuit elements thus formed in the I/O cell forming regions 3 are connected properly by conductors to construct various functional circuits, such as an input buffer circuit, an output buffer circuit or a bilateral buffer circuit.

PMOSs and NMOSs for the prebuffer circuit are connected only when the I/O cell is used as an output buffer to phase an internal signal for applying the internal signal to an external circuit.

Referring again to FIG. 2, gate electrodes 5a, 5b, 6a and 6b respectively forming the input PMOSs, the input NMOSs, the PMOSs for the prebuffer circuit, and the NMOSs for the prebuffer circuit within the first cell forming region 3a are extended in the direction of arrangement of the bonding pads 4. Gate electrodes 7a and 8a respectively forming the output NMOSs and the output PMOSs are extended across the direction of arrangement of the bonding pads 4 within the second cell forming range 3b. Forming the electrodes for the input MOSs and the MOSs for the prebuffer circuit so as to extend in the direction of arrangement of the bonding pads 4, namely, in a direction substantially perpendicular to a straight line connecting the internal circuit to the bonding pad 4, enables a signal line for transmitting a signal provided by the internal circuit directly to the output buffer circuit or the bonding pad 4 to be extended over the first cell forming region 3a without requiring any additional space in the first cell forming region 3a. If the gate electrodes for the input MOSs and the MOSs for the prebuffer circuit are extended in the same direction as the signal line, a the first cell forming region 3a must be provided with an additional space for the signal line, and the signal line cannot be formed over the MOSs. Accordingly, the first cell forming region 3a must be enlarged.

A space 10 (FIG. 2) is formed because the space available for forming the first cell forming region 3a in correspondence with the second cell forming region 3b in which the output MOSs are formed varies with the position of the first cell forming region 3a with respect to the lengthwise direction of the corresponding side of the pellet. The width of the space 10 corresponding to the first cell forming region 3a formed at a position corresponding to the central portion of the corresponding side of the pellet is the largest and that of the space 10 corresponding to the first cell forming region 3a formed at a position corresponding to the extremity of the corresponding side of the pellet is the smallest. In some cases, any space 10 is not formed at positions corresponding to the extremities of the corresponding side of the pellet. A diffused layer and an aluminum pattern is formed in the space 10, which are used as a guardring for a well potential fixing input circuit including the input MOSs.

Similarly to the basic cells 2, the circuit elements, namely, the MOSFETs, resistances and polysilicon gate electrodes, are formed in accordance with the basic design (master design). Then, after coating the entire surface of the pellet with a layer insulating film, such as a phosphorous silicate glass film (PSG film), contact holes are formed in the layer insulating film. The contact hole forming process and the following processes are modified in accordance with the desired logical functions of the semiconductor integrated circuit device. Then, a first aluminum wiring pattern (hereinafter referred to as "Al-I") is formed on the upper surface.

The Al-I includes lines for constructing logic circuits in the basic cells 2, lines for constructing the input and output circuits in the I/O cells 3, and underlayers for the bonding pads 4. Then, a second layer insulating film is formed, through holes are formed in the second layer insulating film, and then a second aluminum wiring pattern (hereinafter referred to as "Al-II") is formed. The Al-II includes power lines for the I/O cells 3, and pads formed on the Al-I in the same pattern to form the upper layers of the bonding pads 4.

Figure 3A:
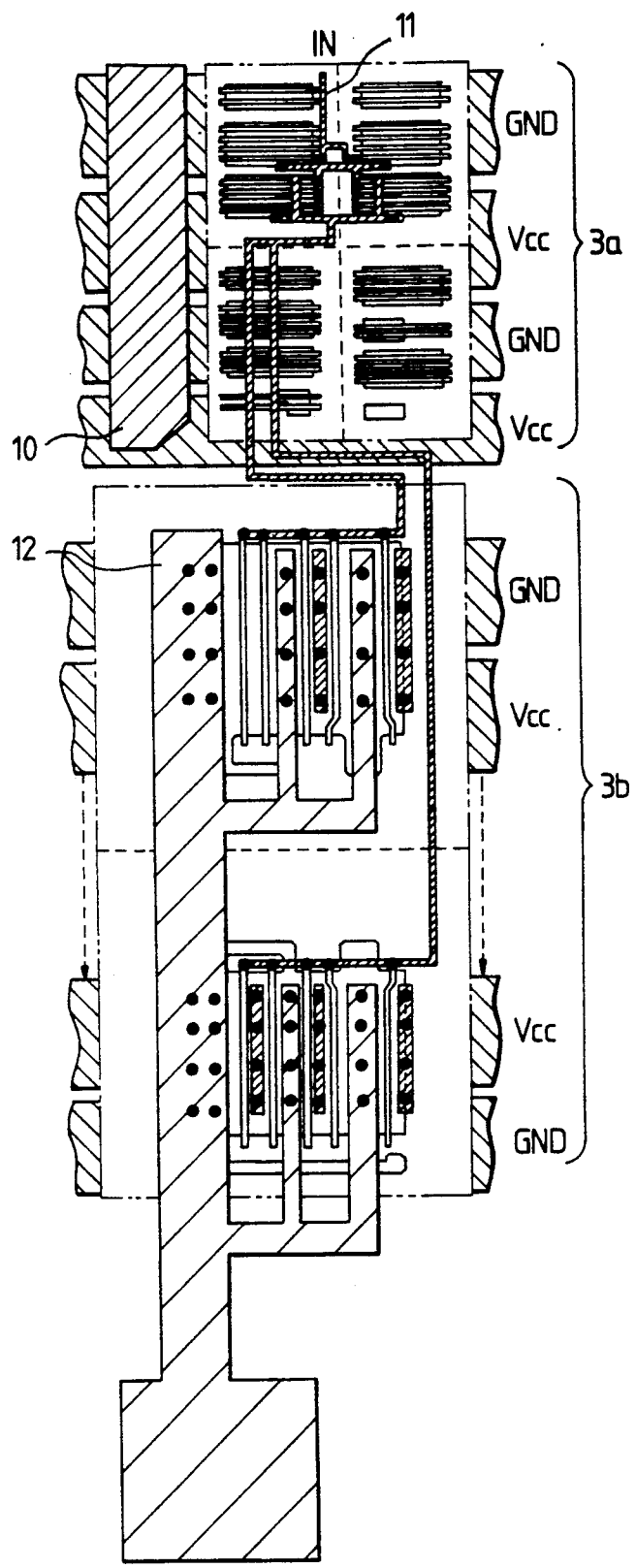
FIG. 3A is a plan view of a plan view of an output buffer circuit formed by wiring the I/O cells shown in FIG. 2.
Figure 3B:
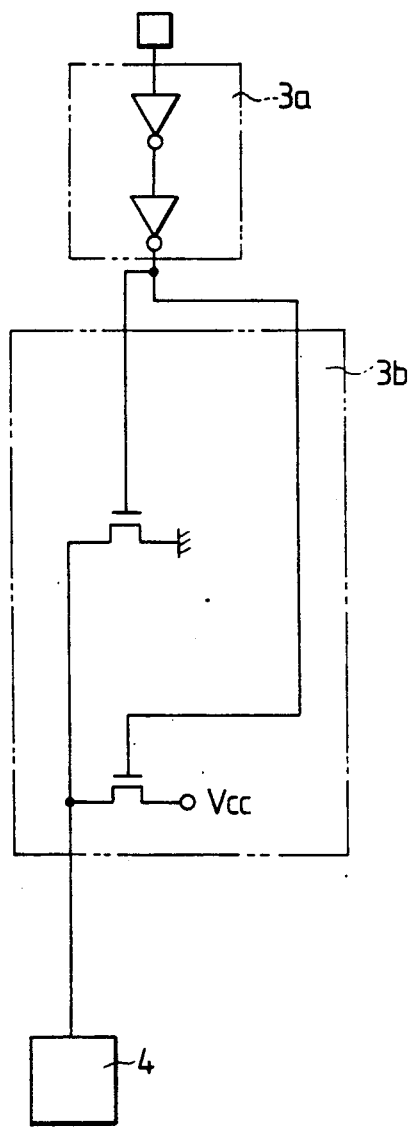
FIG. 3B is a circuit diagram showing an equivalent circuit of the output buffer circuit shown in FIG. 3A.

FIG. 3A shows an output buffer circuit formed by connecting the I/O cells 3 of FIG. 2 by the Al-I and the Al-II, and FIG. 3B shows an equivalent circuit of the output buffer circuit of FIG. 3A. In FIG. 3A, hatched portions are aluminum conductors 11 and 12 including the Al-I and Al-II, and the power lines.

Referring to FIG. 3A, a signal generated in the internal cell array region A is transmitted through the line 11 and the prebuffer circuit formed in the first cell forming region 3a to the second cell forming region 3b. An inverter circuit of a CMOS construction is formed in the second cell forming region 3b by connecting the gate electrodes 7a in the output NMOS region 7 and the gate electrodes 8a in the output PMOS region 8 by the line 11, and connecting the diffused layer 7n in the output NMOS region 7 and the diffused layer 8p in the output PMOS region 8 by the line 12 for transmitting the signal to the bonding pad 4. The bonding pad 4 is connected by a bonding wire to a lead terminal provided on a package, not shown, containing the semiconductor pellet 1, and the lead terminal is connected to a predetermined wiring formed, for example, on a printed wiring board provided outside the package.

Figure 4B:
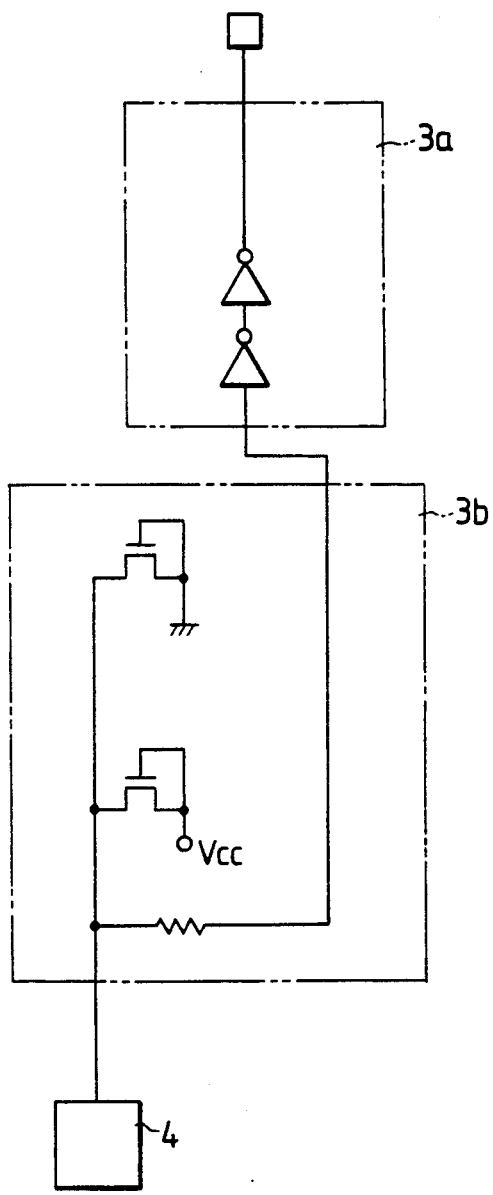
FIG. 4B is a circuit diagram showing an equivalent circuit of the input buffer circuit shown in FIG. 4A.
Figure 4A:
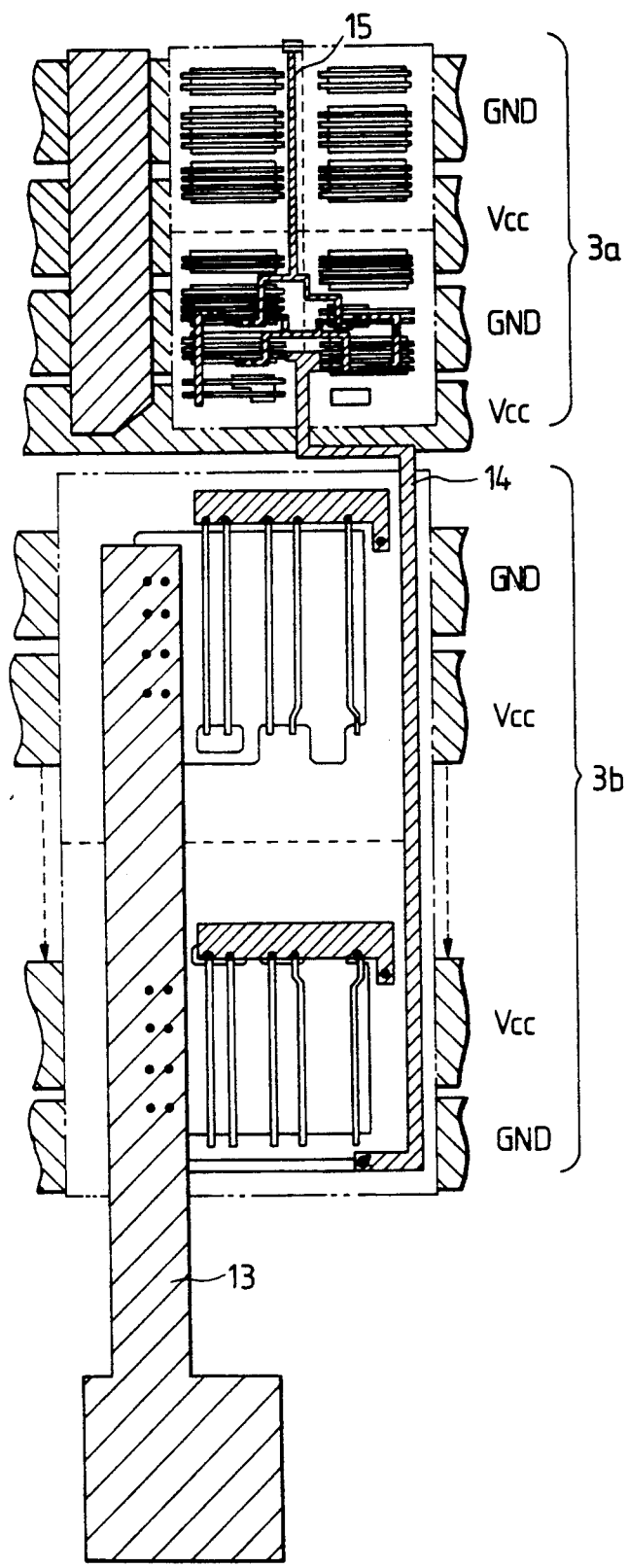
FIG. 4A is a plan view of an input buffer circuit formed by wiring the I/O cells shown in FIG. 2.

Similarly, FIG. 4A shows an input buffer circuit formed by connecting the circuit elements of the I/O cells 3 of FIG. 2 by the Al-I and Al-II, and FIG. 4B shows an equivalent circuit of the input buffer circuit of FIG. 4A. As shown in FIG. 4B, the input buffer circuit comprises an input protection circuit consisting of protective resistance 9 and diodes formed in the second cell forming region 3b, and a two-stage CMOS inverter formed in the first cell forming region 3a. A signal applied to the bonding pad 4 is transmitted through an aluminum conductor 13 to the second cell forming region 3b, through the protective resistance 9 and an aluminum conductor 14 to the two-stage CMOS inverter circuit in the first cell forming region 3a, and further to the internal cell array A through an aluminum conductor 15. Power lines $V_{cc}$ and grounding lines GND shown in FIGS. 3A and 4A are included in the second aluminum wiring pattern Al-II, and other conductors and regions are included in the first aluminum wiring pattern Al-I. A diffused layer, not shown, is formed in the region 9 under the Al-I.

Since each I/O cell region 3 is divided into the first cell forming region 3a and a second cell forming region 3b, the circuit elements for the input circuit are formed in the first cell forming region 3a, and the circuit elements, which are larger than those of the input circuit, for the output circuit are formed in the second cell forming region 3b as shown in FIGS. 1 to 4B, the width of the first cell forming region 3a on the side of the internal cell array region A is not restricted by the bonding pad 4. Consequently, the first cell forming region 3a can be formed in a small area, and hence the number of the first cell forming regions 3a which can be arranged around the external wiring region C is increased accordingly. The incremental second cell forming regions 3b corresponding to the incremental first cell forming regions 3a are formed in the corners of the semiconductor pellet 1. The lower limit of the width of the second cell forming regions 3b is restricted by the bonding pads 4 and hence the width of the second cell forming regions cannot be diminished below a value limited by the bonding pads 4. However, since the periphery of the wiring region D is greater than that of the external wiring region C, the second cell forming regions 3b as many as the first cell forming regions 3a can be arranged properly on the semiconductor pellet 1.

Thus, the semiconductor integrated circuit device in the first embodiment has the following advantages.

(1) The CMOS gate array in accordance with the present invention is provided with the I/O cell forming regions 3 and the bonding pads 4 disposed in the corners of the semiconductor pellet 1a, in which no I/O cell forming region is disposed in the conventional gate array. Accordingly, the CMOS gate array of the present invention can be provided with more I/O cell forming regions 3 and more bonding pads 4 than those of the conventional gate array using a semiconductor pellet of the same size.

(2) Accordingly, the CMOS gate array in the first embodiment of the present invention can be provided with more I/O cell forming regions 3 to increase the number of logic gates, hence the number the pins, so that the CMOS/ gate array can be incorporated into a complex system.

(3) Since the first cell forming regions 3a and the second cell forming regions are separated by the wiring region D, namely, the input PMOS region 5 and the input NMOS region 6 in the first cell forming region 3a are separated from the output NMOS region 7 and the output PMOS region 8 in the second cell forming region 3b, the CMOS gate array is resistant to latch-up and noise.

(4) Accordingly, the input PMOS region 5 and the input NMOS region 6 in the first cell forming region 3a can be further miniaturized, which further increases the density of the circuit elements.

(5) When the number of the I/O cell forming regions 3 arranged on the semiconductor pellet is the same as that of the conventional gate array, the semiconductor pellet of the CMOS gate array of the present invention is smaller than that of the conventional gate array, so that the CMOS gate array of the present invention reduces the manufacturing cost.

Figure 5:
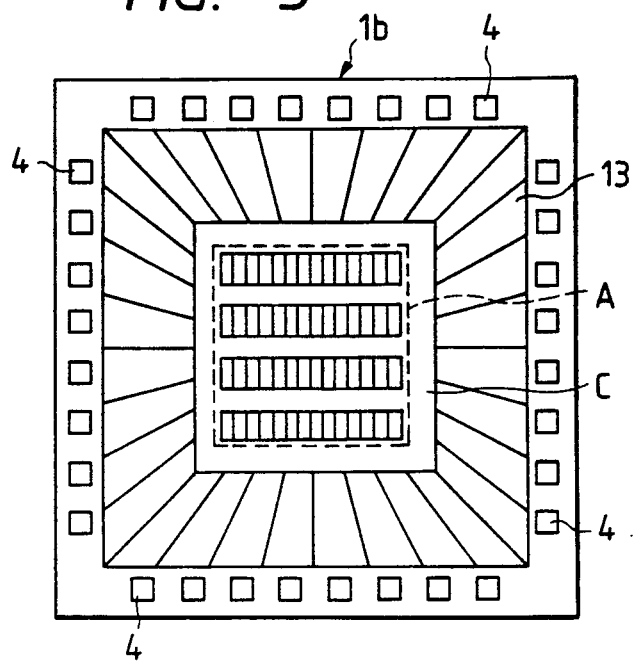
FIG. 5 is a schematic plan view of a semiconductor integrated circuit device in a second embodiment according to the present invention.
Figure 6:
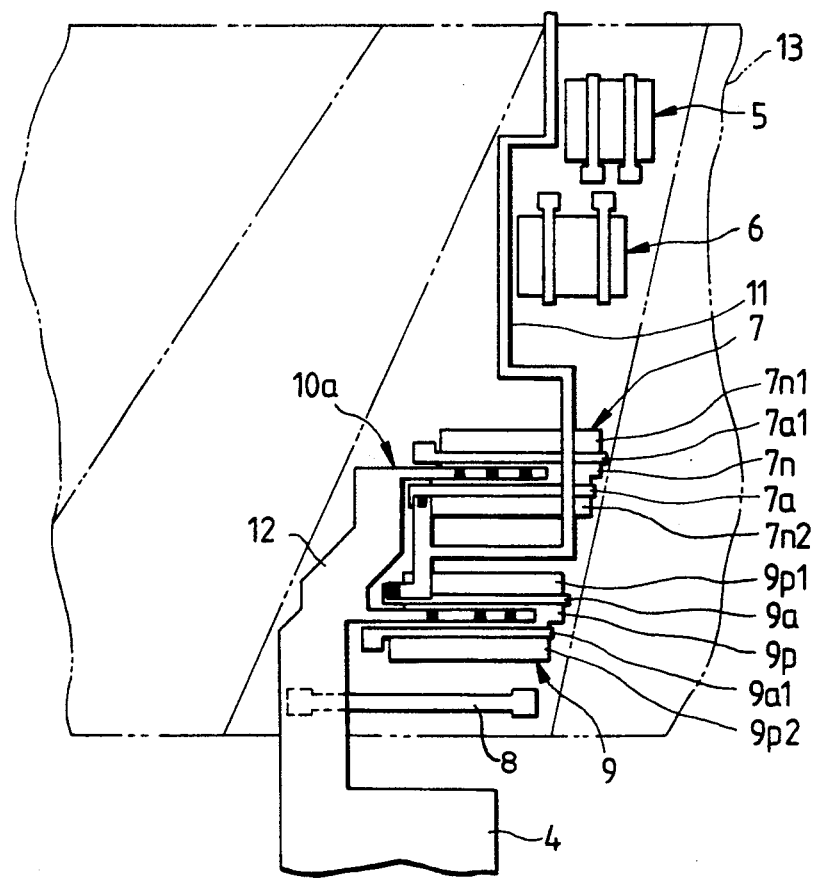
FIG. 6 is an enlarged schematic plan view of an output buffer circuit formed in the I/O cell forming region of the semiconductor integrated circuit shown in FIG. 5.

Second Embodiment (FIGS. 5, 6)

Referring to FIG. 5, a plurality of I/O cell forming regions 13 are formed contiguously and radially around an external wiring region C formed around an internal cell array region A on a semiconductor pellet 1a. The width of each I/O cell forming region 13 decreases from the outer end toward the inner end thereof. That is, the width of one end of the I/O cell forming region 13 near a corresponding bonding pad 4 is restricted by the bonding pad 4 and hence the width of this end cannot be changed. However, since the width of the other end of the I/O cell forming region 13 near the internal cell array region A is not restricted by the bonding pad 4, the width of the other end of the I/O cell forming region 13 is smaller than that of the end near the bonding pad 4.

As shown in FIG. 6, an input PMOS region 5 and an input NMOS region 6 are formed in the I/O cell forming region 13 in conformity with the shape of the I/O cell forming region 13 near the internal cell array region A, and protective resistance 8, an output NMOS region 7 and an output PMOS region 9 are formed in the I/O cell forming region 13 near the bonding pad 4.

The output NMOS region 7 and the output PMOS region 9 are formed in conformity with the shape of the I/O cell forming region 13, while the gate electrodes $7_a$ and $7_{a1}$ of the output NMOS region 7, the gate electrodes $9_a$ and $9_{a1}$ of the PMOS region 9, the n+ diffused layers $7_n$, $7_{n1}$ and $7_{n2}$ of the output NMOS region 7, and the p+ diffused layers $9_p$, $9_{p1}$ and $9_{p2}$ of the output PMOS region 9 are formed in conformity with the shape of the I/O cell forming region 13.

The circuit elements thus formed in the I/O cell forming region 13 are connected by conductors to form, for example, an input buffer circuit, an output buffer circuit or a bilateral buffer circuit. FIG. 6 shows an output buffer circuit 10a, in which the gate electrode 7a of the output NMOS region 7 and the gate electrode 9a of the output PMOS region 9 are connected by a signal line 11 for transmitting signals generated in the internal cell array region A, and the n+ diffused layer $7_n$ of the output NMOS region 7 and the p+ diffused layer $9_p$ of the output PMOS region 9 are connected by a signal line 12 for transmitting signals to the bonding pad 4. A line 12a is extended obliquely along the boundary of the I/O cell forming region 13.

In the second embodiment, the I/O cell forming regions 13 are tapered from the periphery of the semiconductor pellet 1 toward the center of the internal cell array region A. Therefore, the corner portions of the semiconductor pellet 1, in which no I/O cell forming region is formed in the conventional semiconductor integrated circuit device, is used effectively, so that the semiconductor pellet 1 can be provided with more I/O cell forming regions 13 and more bonding pads 4 than the semiconductor pellet of the same size of the conventional semiconductor integrated circuit device. The semiconductor integrated circuit device in the second embodiment has the same advantages as that in the first embodiment excluding the advantages (3) and (4) of the latter.

The representative embodiments of the present invention disclosed herein have the following advantages.

The semiconductor device of a master slice system has an internal cell array region formed in a portion of a semiconductor pellet, and a plurality of I/O cell forming regions formed in a radial layout around the internal cell array region, in which each I/O cell forming region is divided into a plurality of cell forming regions radially arranged in order of size from the outer end toward the inner end of the semiconductor pellet. Accordingly, the I/O cell forming regions and the bonding pads can be formed in the corner portions of the semiconductor pellet and hence the semiconductor pellet is provided with more I/O cell forming regions than the semiconductor pellet of the same size of the conventional semiconductor device.

The semiconductor device of a master slice system has an internal cell array region formed in a portion of a semiconductor pellet, and a plurality of I/O cell forming regions formed in a radial layout around the internal cell array region, in which each I/O cell forming region is tapered from the outer end toward the inner end thereof. Accordingly, the I/O cell forming regions and the bonding pads can be formed in the corner portions of the semiconductor pellet and hence the semiconductor pellet is provided with more I/O cell forming regions than the semiconductor pellet of the same size of the conventional semiconductor device.

The disposition of circuit elements for an input circuit on the side of the internal cell array region and the disposition of circuit elements for an output circuit on the side of the periphery of the semiconductor pellet enables the circuit elements to be formed in an I/O cell forming region having a comparatively small area, so that the semiconductor pellet can be provided with more I/O cell forming regions than the semiconductor pellet of the conventional semiconductor device.

Although the present invention has been described with reference to the preferred embodiments thereof, the present invention is not limited thereto in its application and many changes and variations may be made without departing from the scope and spirit thereof.

For example, the arrangement and connection of the MOS transistors for the input circuit and those of the MOS transistors for the output circuit are not limited to those described with reference to the first and second embodiments.

Although the I/O cell forming region of the semiconductor integrated circuit device in the first embodiment consists of the two cell forming regions, namely, the first cell forming region and the second cell forming region, the I/O cell forming region may have additional cell forming regions, for example, a third cell forming region and a fourth cell forming region.

Although the present invention has been described mainly as applied to a gate array, which is the principal purpose of application of the present invention, the present invention is applicable also to other semiconductor integrated circuit devices, such as those having standard cells, a composite gate array or a bi-CMOS circuit having an input circuit cell forming region provided with both bipolar transistors and MOS transistors.

What is claimed is:

1. A semiconductor integrated circuit device comprising:
    a semiconductor substrate having a main surface with a rectangular shape;
    internal cells comprised of basic cells formed in an internal cell region on said main surface;
    input/output cells for input/output buffer circuits formed at an outer peripheral region of the rectangular-shaped main surface of said semiconductor substrate in such a manner that, with respect to each one of four end sides of the rectangular-shaped main surface, said input/output cells are continuously arranged in a direction parallel to an adjacent end side of the rectangular-shaped main surface, each of said input/output cells including a first cell and a second cell which is formed more distantly from said internal cells than said first cell,
    wherein said first cell is comprised of first MISFETs formed in a first cell forming region of said main surface,
    wherein said second cell is comprised of second MISFETs which have a greater ratio of a gate width-to-gate length than said first MISFETs, respectively, and which are formed in a second cell forming region of said main surface,
    wherein said first cells and said second cells of each continuous arrangement of input/output cells, adjacent a corresponding end side of the rectangular-shaped main surface, are formed as separate, continuous arrangements of first cells and second cells disposed, respectively, along a direction parallel to the adjacent end side of the rectangular-shaped main memory,
    wherein a combined width, corresponding to a distance in said direction of all first cells of a continuous arrangement adjacent an end side is less than a width of all second cells of a continuous arrangement corresponding thereto, and
    wherein a spacing distance, in said direction, between each one of a pair of other end sides of said rectangular-shaped main surface, joined to said adjacent end side at right angles, and said first cells of input/output cells corresponding to said adjacent end side is greater than a spacing distance between each one of said pair of other end sides and said second cells of input/output cells corresponding to said adjacent end side; and
    external terminals on said main surface formed, respectively, near corresponding ones of said input/output cells and more distantly from said internal cell region than said input/output cells.

2. A semiconductor integrated circuit device according to claim 1, wherein said first MISFETs include p-channel MISFETs and n-channel MISFETs, and said second MISFETs include p-channel MISFETs and n-channel MISFETs.

3. A semiconductor integrated circuit device according to claim 1, wherein said internal cell region is rectangular-shaped and centrally disposed on the rectangular-shaped main surface of said semiconductor substrate, and wherein each pair of end sides of the rectangular-shaped internal cell region is in parallel with a respective pair of end sides of the rectangular-shaped main surface.

4. A semiconductor integrated circuit device according to claim 1, wherein said first and second cells are arranged in a radial layout around said internal cell region.

5. A semiconductor integrated circuit device according to claim 2, wherein said first MISFETs include p-channel MISFETs and n-channel MISFETs, and said second MISFETs include p-channel MISFETs and n-channel MISFETs.

6. A semiconductor integrated circuit device according to claim 5, wherein said first and second cells are arranged in a radial layout around said internal cell region.

7. A semiconductor integrated circuit device according to claim 1, wherein said input/output cells are formed to surround said internal cell region.

8. A semiconductor integrated circuit device comprising:
    a semiconductor substrate having a main surface;
    an internal cell array including a plurality of basic cells and being formed on said main surface, said internal cell array being provided in a rectangular-shaped region, at a centrally located area of said main surface, on said semiconductor substrate;
    external terminals formed, on said main surface, adjacent an outer periphery of said semiconductor substrate, and disposed to surround the internal cell array;
    a plurality of basic cells for input and output buffer circuits formed, on said main surface, at an outer peripheral region of said semiconductor substrate between said internal cell array and said external terminals;

wherein said plurality of basic cells for input and output buffer circuits are formed in first cell forming regions and second cell forming regions of said main surface, the respective first cell forming regions thereof are disposed adjacent corresponding end sides of said rectangular-shaped region, and the second cell forming regions thereof are disposed so as to be further distanced from said rectangular-shaped region and closer to the corresponding external terminals than are the respectively corresponding first cell forming regions;

wherein each first cell forming region has a width, corresponding to a distance in a direction parallel to an adjacent end side of said rectangular-shaped region, which is relatively less than a similarly defined width of the second cell forming regions;

wherein each one of said plurality of basic cells for input and output buffer circuits is associated with a first cell forming region and a corresponding second cell forming region;

wherein the number of said first cell forming regions is the same as that of said second cell forming regions;

wherein in each one of said plurality of basic cells for input and output buffer circuits, the first and second cell forming regions are separated by a wiring region; and wherein each first cell forming region of said plurality of basic cells includes PMOS and NMOS pre-buffer circuit regions and PMOS and NMOS input circuit regions, respectively, and each second cell forming region associated therewith includes NMOS and PMOS regions for effecting an output circuit, said NMOS and PMOS output circuit regions being respectively greater in area than said respective NMOS and PMOS regions of said first cell forming region associated therewith.

9. A semiconductor integrated circuit device according to claim 8, wherein said plurality of basic cells for input and output buffer circuits are separated from said rectangular-shaped region of said internal cell array by an external wiring region surrounding it.

10. A semiconductor integrated circuit device according to claim 8, wherein each one of said external terminals is comprised of a bonding pad.

11. A semiconductor integrated circuit device comprising:
a semiconductor substrate having a main surface;
an internal cell array including a plurality of basic cells and being formed on said main surface, said internal cell array being disposed in a rectangular-shaped region on said semiconductor substrate;
external terminals formed, on said main surface, around the internal cell array so as to surround the internal cell array;
a plurality of basic cells for input and output buffer circuits, formed in a radial layout around respective end sides of said rectangular-shaped region of said internal cell array, each of said basic cells for input and output buffer circuits being provided with a plurality of circuit elements to be interconnected to provide at least one of an input circuit, an output circuit and an input-output circuit;
wherein said plurality of basic cells for input and output buffer circuits respectively correspond to regions of said semiconductor substrate which gradually widen in a radially outwardly going direction from said rectangular-shaped region;

wherein with respect to each end side of said rectangular-shaped region, radially inner end forming portions of the plurality of basic cells for input and output buffer circuits correspond to respective areas on the main surface of said semiconductor substrate for providing first cell forming regions for effecting input buffer circuits and those portions thereof which correspond to radially outer end forming regions thereof correspond to respectively greater areas on said main surface for providing second cell forming regions for effecting output buffer circuits;

wherein each first cell forming region of a basic cell has a width, corresponding to a distance in a direction parallel to an adjacent end side of said rectangular-shaped region, which is relatively less than a similarly defined width of the second cell forming region thereof; and wherein those first cell forming regions disposed closer to the corners of said rectangular-shaped region respectively cover a relatively smaller area than those disposed adjacent to a more centrally located portion of each end side.

12. A semiconductor integrated circuit device according to claim 11, wherein said plurality of basic cells are separated from said rectangular-shaped region of said internal cell array by an external wiring region surrounding it.

13. A semiconductor integrated circuit device according to claim 12, wherein said rectangular-shaped region is disposed in a centrally located area on said semiconductor substrate.

14. A semiconductor integrated circuit device according to claim 13, wherein said plurality of basic cells for input and output buffer circuits are formed at an outer peripheral region of said semiconductor substrate, and wherein said external terminals are respectively disposed adjacent the outer periphery of said semiconductor substrate.

15. A semiconductor integrated circuit device according to claim 11, wherein each one of said external terminals is comprised of a bonding pad.

16. A semiconductor integrated circuit device comprising:
a semiconductor substrate having a main surface;
internal cells comprised of basic cells, said internal cells being disposed in a rectangular-shaped region of said main surface;
input/output cells for input/output buffer circuits disposed to surround an outer periphery of said rectangular-shaped region, each of said input/output cells having a first cell and a second cell, said second cell being disposed more distantly from said rectangular-shaped region than said first cell, said first cell being comprised of first MISFETs including p-channel MISFETs and n-channel MISFETs, and said second cell being comprised of second MISFETs including p-channel MISFETs and n-channel MISFETs which have a gate-width to gate-length ratio greater than that of the p-channel and n-channel MISFETs corresponding to said first MISFETs, respectively;
wherein each said first cell is formed in a respective first cell forming region of said main surface and each said second cell is formed in a respective second cell forming region of said main surface;

wherein a combined width, corresponding to a distance in a direction parallel to an adjacent end side of said rectangular-shaped region, of all first cell forming regions disposed along a corresponding end side of said rectangular-shaped region is less than that of a combined width of said second cell forming regions associated therewith; and external terminals on said main surface disposed, respectively, near corresponding ones of said input/output cells and more distantly from said rectangular-shaped region than said input/output cells.

17. A semiconductor integrated circuit device according to claim 16, wherein said n-channel MISFETs of said first MISFETs are disposed more distantly from said rectangular-shaped region than said p-channel MISFETs of said first MISFET, and said p-channel MISFETs of said second MISFETs are disposed more distantly from said rectangular-shaped region than said n-channel MISFETs of said second MISFET.

18. A semiconductor integrated circuit device according to claim 16, wherein said first cell is for input buffer circuit, and said second cell is for input/output buffer circuit.

19. A semiconductor integrated circuit device adopting a gate array scheme, comprising:

a semiconductor substrate having a main surface;

internal cells comprised of basic cells, wherein said internal cells are disposed in a rectangular-shaped region of said main surface;

input/output cells for input/output buffer circuits disposed to surround an outer periphery of said internal cells, each of said input/output cells having a first cell and a second cell which is disposed more distantly from said rectangular-shaped region than said first cell, said first cell being comprised of first complementary MISFETs, said second cell being comprised of second complementary MISFETs which have a gate-width to gate-length ratio greater than that of said first complementary MISFETs, respectively;

wherein each said first cell is formed in a respective first cell forming region of said main surface and each said second cell is formed in a second cell forming region of said main surface;

wherein a wiring region on said main surface is disposed between first cell forming regions and second cells forming regions;

wherein a combined width, corresponding to a distance in a direction parallel to an adjacent end side of said rectangular-shaped region, of all first cell forming regions disposed along a corresponding end side of said rectangular-shaped region is less than that of a combined width of said second cell forming regions associated therewith; and external terminals on said main surface disposed, respectively, near corresponding ones of said input/output cells and more distantly from said rectangular-shaped region than said input/output cells.

20. A semiconductor integrated circuit device according to claim 19, wherein said first MISFETs have a gate-width greater than that of said second MISFETs, respectively.

21. A semiconductor integrated circuit device comprising:

a semiconductor substrate having a main surface with a rectangular shape;

internal cells comprised of basic cells formed in an internal cell region on said main surface;

input/output cells for input/output buffer circuits being disposed nearer an outer periphery of the rectangular-shaped main surface than said internal cells, each of said input/output cells having a first cell and a second cell which is disposed more distantly from said internal cell region than said first cell, said first cell being comprised of first MISFETs including p-channel MISFETs and n-channel MISFETs, and said second cell being comprised of second MISFETs which have a gate width-to-width length ratio greater than that of the p-channel and n-channel MISFETs corresponding to said first MISFETs, respectively;

wherein each said first cell is formed in a respective first cell forming region of said main surface and each said second cell is formed in a respective second cell forming region of said main surface;

wherein a combined width, corresponding to a distance in a direction parallel to an adjacent end side of the rectangular-shaped main surface, of all first cell forming regions disposed between said internal cell region and a corresponding end side of the rectangular-shaped main surface is less than that of a combined width of said second cell forming regions associated therewith; and external terminals on said main surface disposed, respectively, near corresponding ones of said input/output cells and more distantly from said internal cell region than said input/output cells.

22. A semiconductor integrated circuit device according to claim 21, wherein a wiring region on said main surface is disposed between said first cell forming regions and second cell forming regions.

23. A semiconductor integrated circuit device according to claim 21, wherein said semiconductor integrated circuit device adopts a gate array scheme.

24. A semiconductor integrated circuit device according to claim 22, wherein said internal cell region is rectangular-shaped and centrally disposed on the rectangular-shaped main surface of said semiconductor substrate, and wherein each pair of end sides of the rectangular-shaped internal cell region is in parallel with a respective pair of end sides of the rectangular-shaped main surface.

25. A semiconductor integrated circuit device according to claim 21, wherein said input/output cells are formed to surround said internal cell region.

* * * * *